Jan. 7, 1969 R. E. ANDREWS 3,421,102
DIRECT COUPLED TEMPERATURE COMPENSATED AMPLIFIER
Filed June 10, 1965
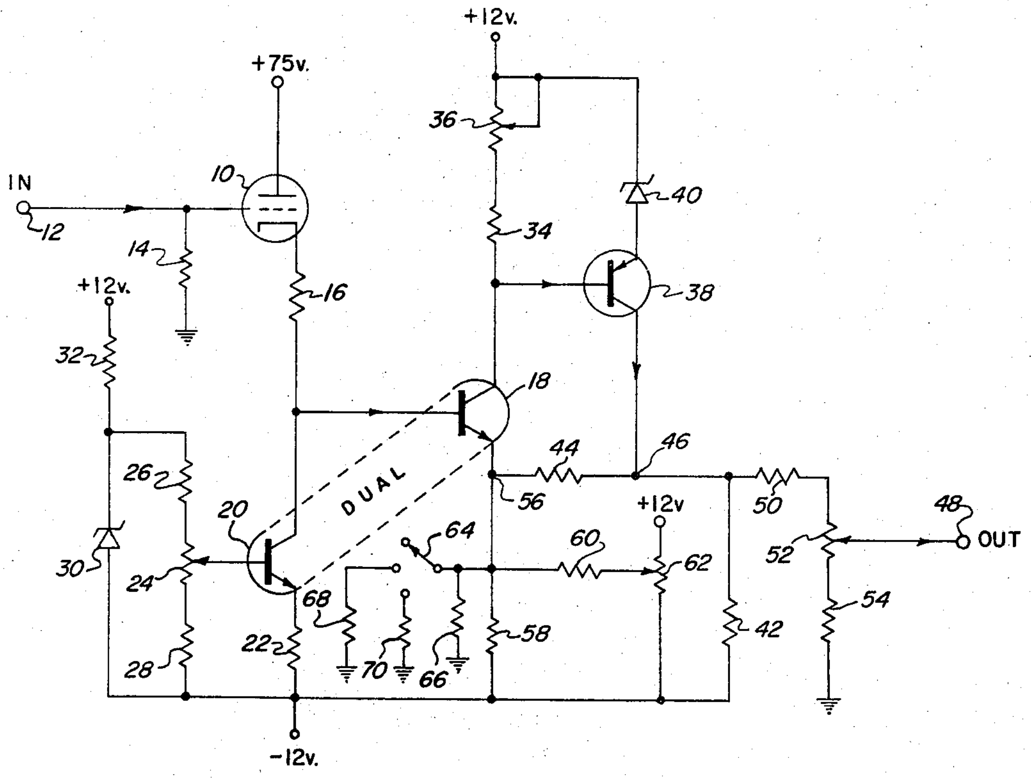
ROLAND E. ANDREWS
INVENTOR
BY
BUCKHORN, BLORE, KLARQUIST & SPARKMAN
ATTORNEYS United States Patent Office 3,421,102
Patented Jan. 7, 1969

3,421,102
DIRECT COUPLED TEMPERATURE COMPENSATED AMPLIFIER

Roland E. Andrews, Portland, Oreg., assignor to Tektronix, Inc., Beaverton, Oreg., a corporation of Oregon
Filed June 10, 1965, Ser. No. 462,833
U.S. Cl. 330—23 7 Claims
Int. Cl. H03f *3/04;* H03k *1/12*

ABSTRACT OF THE DISCLOSURE

A temperature compensated direct coupled amplifier is described in which a compensating transistor having a D.C. reference voltage applied to its base reduces thermal drift in the output voltage of such amplifier. The collector of the compensating transistor is connected to the base of a common emitter amplifier transistor and through one load resistor to the cathode of a cathode follower amplifier tube. The emitter of the compensating transistor is connected to another load resistor which is substantially equal to the sum of such one load resistor and the internal cathode-to-anode resistance of the tube to provide such compensating transistor with a voltage gain of —1. This, together with maintaining the transistors at the same temperature, such as by providing them in a common housing, causes a reduction of the thermal drift to about 0.2 millivolt per degree centigrade over a temperature range of —15° to —55° C.

The subject matter of the present invention is related in general to electrical amplifier circuits of the direct coupled type, and in particular to a temperature compensated direct coupled amplifier whose output voltage does not vary appreciably with changes in temperature over a wide range of temperatures. Briefly, the amplifier circuit of the present invention employs a compensating transistor which applies a correction voltage to the base of the amplifier transistor being temperature compensated, such correction signal being of the proper amplitude and polarity to effectively cancel the change in emitter to base voltage of such amplifier transistor caused by thermal drift so that the D.C. output voltage of the amplifier remains substantially constant.

The temperature compensated amplifier of the present invention is especially useful as the vertical preamplifier stage of a wide band cathode ray oscilloscope since it has a wide frequency response from D.C. up to about 100 megacycles per second. Since direct coupled amplifiers amplify D.C. voltages, any change in the quiescent bias votlage of a transistor in such amplifier due to variations in temperature will cause a corresponding change in the quiescent output voltage of the amplifier. This undesirable "thermal drift" has been prevented or reduced in previous direct coupled transistor amplifiers by means of complicated circuits. Some of the previous circuits use correction devices external of the amplifier to detect the drift voltage by comparing the input and output voltages of the amplifier, modulating the D.C. drift voltage to produce an A.C. signal which is then amplified and demodulated to produce a D.C. correction signal, and applying such correction signal to the amplifier to reduce the drift voltage.

The amplifier of the present invention has several advantages over such previous temperature compensated amplifiers, including a simpler and less expensive construction. Furthermore, while its temperature compensation is not quite as effective as the above mentioned external stabilized amplifiers or the differential connected amplifiers of the prior art, the present amplifier still has very low thermal drift of about 0.2 millivolt per degree centigrade over a wide temperature range of —15° C. to +55° C. In addition, the present amplifier employs a balancing circuit so that the output voltage of the amplifier does not change with variations in the gain of the amplifier or with power supply variations.

It is therefore one object of the present invention to provide an improved direct coupled amplifier circuit having a low thermal drift in its quiescent output voltage over a wide range of temperatures.

Another object of the invention is to provide a temperature compensated direct coupled amplifier of simple and inexpensive construction.

A further object of the present invention is to provide an improved temperature compensated direct coupled amplifier which is very stable and has an extremely wide band frequency response.

An additional object of the present invention is to provide a temperature compensated direct coupled amplifier whose quiescent output voltage is not changed when the gain of such amplifier is varied or with power supply variations.

Other objects and advantages of the present invention will be apparent from the following detailed description of a preferred embodiment thereof and from the attached drawings of which:

The figure is a schematic diagram of one embodiment of the temperature compensated direct coupled amplifier of the present invention.

As shown in the drawing, the temperature compensated direct coupled amplifier of the present invention includes an electronic amplifier device 10, such as a triode vacuum tube of the 8393 type sold by Radio Corporation of America under the trademark "Nuvistor," or other electron discharge device, having its grid connected to an input terminal 12 of such amplifier and its anode connected to a source of positive D.C. supply voltage of +75 volts. A bias resistor 14 of 1 megohm is connected between the grid of tube 10 and ground, while a load resistor 16 of 238 ohms is connected at one terminal to the cathode of such tube so that the tube is connected as a cathode follower amplifier and is quiescently biased conducting. The other terminal of resistor 16 is connected to the base of a semiconductor device 18, such as an NPN transistor which functions as a voltage inverter amplifier for the signal transmitted from the cathode of tube 10 to provide a hybrid amplifier circuit.

Another semiconductor device 20, such as an NPN transistor similar to transistor 18, is provided with its collector connected to the base of transistor 18 and to load resistor 16, and with its emitter connected to a source of negative D.C. voltage of —12 volts through a load resistor 22 of 422 ohms. Transistor 20 acts as a current source for tube 10 to provide such tube with a nearly unity voltage gain. The value of the emitter load resistance 22 of transistor 20 is made equal to the sum of the load resistor 16 and the internal cathode-to-anode resistance of tube 10, or the reciprocal of its mutual conductance ($1/G_m$) so that the compensating transistor 20 has a gain of —1 for changes in the forward bias voltage produced across its emitter-to-base junction. Transistor 20 is chosen to have a similar characteristic to transitor 18 and such transistors are mounted on a common heat sink. This may be accomplished by enclosing transistors 18 and 20 within the same housing, such a a dual tranistor of the 2N918 type. In this way the temperature of transistor 20 is maintained equal to that of transistor 18, so that he changes in base-to-emitter voltage of such transistors due to variations in temperature are substantially the same at about 2.0 millivolt per ° C.

The base of transistor 20 is connected to the movable contact of a potentiometer 24 of 100 ohms whose end terminals are connected through resistors 26 and 28 of 825 ohms and 237 ohms, respectively, to the cathodes and anode of a Zener diode 30 of the 1N936 type. The Zener diode maintains a constant voltage of 9 volts across the series circuit of resistors 24, 26 and 28. The cathode of the Zener diode 30 is connected to a source of positive D.C. supply voltage of +12 volts through a dropping resistor 32 of 953 ohms, while the anode of such Zener diode is connected to the negative D.C. supply voltage of −12 volts. This means that a voltage of −3 volts is maintained on the upper terminal of resistor 26 and the voltage applied to the base of transistor 20 varies between about −9.4 and −10.2 volts to quiescently bias such transistor conducting.

The collector of transistor 18 is connected to a source of positive D.C. supply voltage of +12 volts through a fixed load resistor 34 of 1.54 kilohms in series with a variable load resistance 36 of 500 ohms. The voltage across load resistances 34 and 36 is maintained substantially constant at about 7.0 volts by the emitter to base voltage of a normally conducting transistor 38 of the PNP type 2N3546 having its base connected to the collector of transistor 18, and the anode to cathode voltage of a Zener diode 40 of the 6.2 volts type. Diode 40 has its anode connected to the cathode of transistor 38 and its cathode connected to the +12 volts D.C. supply voltage. This maintains the current flow through load resistors 34 and 36 substantially constant at about 3.44 ma. so that the collector current of transistor 18 is also maintained constant at approximately this same value to prevent any variation of the power supply from affecting the emitter to collector current of transistor 18.

The collector of transistor 38 is connected to the source of negative D.C. supply voltage of −12 volts through a load resistance 42 of 1.2 kilohms and is also connected to the emitter of transistor 18 through a feedback resistor 44 of 511 ohms. The common connection 46 of the collector of transistor 38 and feedback resistor 44 is connected to an output terminal 48 of the amplifier through a resistor 50 of 140 ohms and a potentiometer 52 of 250 ohms whose movable contact is connected to such output terminal. The other terminal of potentiometer 52 is connected to ground through a resistor 54 of 150 ohms. Thus the potentiometer 52 provides a continuously variable gain control for the amplifier circuit, since changing the setting of its movable contact varies the output voltage produced on output terminal 48.

The common connection 56 of the emitter of transistor 18 and coupling resistor 44 is connected to a source of negative D.C. supply voltage of −12 volts through a load resistor 58 of 2.87 kilohms and is connected through a resistor 60 of 8.25 kilohms to the movable contact of a potentiometer 62 of 10 kilohms. The end terminals of potentiometer 62 are connected to a positive D.C. supply voltage of +12 volts and to a negative D.C. supply voltage of −12 volts. The movable contact on potentiometer 24 at the base of transistor 20 is adjusted until the voltage of the common connection 56 at the emitter of transistor 18 is at a D.C. voltage of 0 volt. Then the movable contact of variable resistor 36 is adjusted until the voltage at the common connection 46 is also at a D.C. voltage of 0 volt which is also the quiescent voltage on output terminal 48. This means that there is no D.C. current flow through coupling resistor 44. However, coupling resistor 44 provides negative A.C. voltage feedback from the collector to the emitter of transistor 18 since the input signal applied to the base of such transistor is inverted twice by transistors 18 and 38 before it is applied to the emitter of transistor 18 in the same phase as such input signal. This negative feedback stabilizes the amplifier and provides it with a wide band frequency response from D.C. up to about 100 megacycles per second.

A step gain switch 64, having its movable contact connected to the emitter of transistor 18 and also connected to ground through a resistor 66 of 365 ohms, is provided to vary the gain of the amplifier in discrete steps. Switch 64 may be a three-position switch whose first position is unconnected or floating in potential to provide a voltage gain of 2.5 for the amplifier circuit. In the next counterclockwise position of switch 64, it is connected to a resistor 68 of 191 ohms whose other terminal is grounded so resistors 68 and 66 are connected in parallel to provide a voltage gain of 5 for the amplifier. In the third position of the switch, its movable contact is connected to a resistor 70 of 63.4 ohms, whose other contact is also grounded, to provide a voltage gain of 10 for the amplifier. Since the common connection point 56 at the emitter of transistor 18 is maintained at a D.C. voltage of 0 volt, so long as the quiescent voltage at input terminal 12 is 0 volt, there is no D.C. current flow through switch 64 or through resistors 66, 68 or 70. This means that regardless of the position of the step gain switch 64 the quiescent D.C. output voltage of the amplifier does not change. Also, no power supply variation is introduced into the output voltage by varying the setting of the step gain switch 64.

As stated previously, transistor 38 and Zener diode 40 maintain a constant voltage drop across load resistances 34 and 36 in order to prevent their power supply variations from affecting the collector current of transistor 18 and to maintain point 56 at zero volt D.C. potential. It should also be noted that the temperature coefficient of the Zener diode 40 is chosen to be a complementary match of that of the emitter junction of transistor 38, so that their temperature variations compensate for one another. The other Zener diode 30 regulating the voltage across resistors 24, 26 and 28 is chosen to have a zero temperature coefficient so that it does not contribute to thermal drift. In addition, it should be noted that vacuum tube 10 also has a zero temperature coefficient.

It follows from the above that the main remaining source of any thermal drift in the output voltage is the base-to-emitter voltage variation of transistor 18. However, as stated previously, compensation transistor 20 is chosen so that its characteristics match that of transistor 18 and it is maintained at substantially the same temperature to "track" the operating point of this transistor. For the transistor types indicated, the base-to-emitter voltage changes about 2 millivolts per degree centigrade for transistors 18 and 20. Therefore as the temperature increases the emitter-to-base voltage of transistor 18 decreases, which causes its emitter to go more positive and tends to drive the collector of transistor 18 to a more negative voltage. However, at the same time this increase in temperature causes a decrease in the base-to-emitter voltage of transistor 20, which drives its emitter more positive and causes its collector to go to a more negative potential. The negative voltage change produced on the collector of transistor 20 is applied to the base of transistor 18 so that it tends to drive the collector of transistor 18 positive and cancel the more negative collector voltage produced by the temperature change of transistor 18. Since the compensating transistor 20 is provided with a voltage gain of −1, the correction voltage produced on the collector of such transistor is equal to but opposite in phase with the change in base-to-emitter voltage of transistor 18, thereby cancelling all of such change in base-to-emitter voltage. Thus transistor 20 maintains the quiescent D.C. output voltage on output terminal 48 substantially constant, regardless of changes in temperature over a wide range of temperatures between −15° C. and +55° C. within which the output voltage changes only about 0.2 millivolt per ° C.

As stated previously, the emitter load resistance 22 of transistor 20 is made equal to its total collector load resistance, including the sum of resistor 16 and the reciprocal of the transconductance of tube 10. Resistor 16 is chosen to be large compared to the reciprocal of the tube transconductance ($1/G_m$) so that variations in the transconductance during operation of the tube do not change the gain of transistor 20 appreciably. In addition, resistor 16 is chosen to provide tube 10 with a cathode voltage of between +1.45 volts and +1.85 volts D.C. bias voltage when the input terminal 12 is provided with a D.C. voltage of 0 volt so that very little grid current flows in the grid of tube 10.

It is possible to enilimate transistor 38 and Zener diode 40 in order to provide a current amplifier in which case the output would be taken from the emitter of transistor 18, so that such transistor functions as an emitter follower amplifier. In addition, vacuum tube 10 could be replaced by a field effect transistor which has a zero temperature coefficient, or such vacuum tube could also be replaced by a conventional junction transistor connected as an emitter follower. However, in this latter case the resistance values of resistors 16 and 22 must be adjusted to provide transistor 20 with a gain of −2, so that such transistor compensates not only for the temperature variation of transistor 18 but also for the conventional junction transistor substituted in place of tube 10.

It will be obvious to those having ordinary skill in the art that many changes may be made in the details of the above described preferred embodiment of the present invention without departing from the spirit of the invention. Therefore, the scope of the present invention should only be determined by the following claims:

I claim:

1. A temperature compensated direct coupled amplifier circuit, comprising:

an electronic amplifying device having its input electrode connected to the input terminal of said circuit;

a first semiconductor device having its base connected to a source of D.C. reference voltage;

a second semiconductor device similar to said first device and having its base connected to the collector of said first device;

a first load resistance connected between a source of D.C. supply voltage and the emitter of said first device;

a second load resistance connected between the collector of said first device and the output electrode of said electronic device; and said first load resistance being substantially equal to the sum of said second load resistance and the internal resistance of said electronic device for causing said first device to apply a D.C. correction voltage to the base of said second device which is equal in amplitude and opposite in phase to the change in emitter to base voltage of said second device caused by variations in temperature of said second device.

2. A temperature compensated direct coupled amplifier circuit, comprising:

an electron discharge device having its input electrode connected to the input terminal of said circuit;

a first transistor having its base connected to a source of regulated D.C. reference voltage;

a second transistor similar to said first transistor and having its base connected to the collector of said first transistor;

a first load resistance connected between a source of D.C. supply voltage and the emitter of said first transistor;

a second load resistance connected between the collector of said first transistor and the output electrode of said discharge device with the sum of said second load resistance and the internal resistance of said discharge device being substantially equal to said first load resistance to provide said first transistor with a negative voltage gain of substantially unity; and said first and second transistors being mounted in a common housing for maintaining the temperature of said first and second transistors substantially the same.

3. A temperature compensated direct coupled amplifier circuit, comprising:

a vacuum tube having its grid connected to the input terminal of said circuit;

a first transistor having its base connected to a source of D.C. reference voltage;

a second transistor similar to said first transistor and having its base connected to the collector of said first transistor;

a first load resistance connected between a source of D.C. supply voltage and the emitter of said first transistor;

a second load resistance connected between the collector of said first transistor and the output electrode of said tube;

said second load resistance being large compared to the internal anode to cathode resistance of said tube which forms part of the collector load resistance of said first transistor, and the sum of said second load resistance and said internal resistance being substantially equal to said first load resistance to provide said first transistor with an emitter to collector voltage gain of substantially −1.0; and means for maintaining the temperature of said first and second transistors substantially the same.

4. A temperature compensated direct coupled amplifier circuit, comprising:

a vacuum tube connected as a cathode follower amplifier with its grid connected to the input terminal of said circuit;

a first transistor;

a potentiometer having its movable contact connected to the base of said first transistor;

a regulated source of D.C. reference voltage connected across said potentiometer;

a first load resistance connected between the cathode of said tube and the collecter of said first transistor;

a second transistor similar to said first transistor, connected as a voltage inverter amplifier with its base connected to the collector of said first transistor;

a second load resistance connected between a source of D.C. supply voltage and the emitter of said first transistor and being substantially equal to the sum of said first load resistance and the internal cathode to anode resistance of said tube;

a third transistor connected as a voltage inverter amplifier with its base connected to the collector of said second transistor and its collector connected to the output terminal of said circuit; and a feedback resistance connected between the collector of said third transistor and the emitter of said second transistor.

5. A temperature compensated direct coupled amplifier circuit, comprising:

a vacuum tube connected as a cathode follower amplifier with its grid connected to the input terminal of said circuit;

a first transistor;

a potentiometer having its movable contact connected to the base of said first transistor;

a regulated source of D.C. reference voltage connected across said potentiometer;

a first load resistance connected between the cathode of said tube and the collector of said first transistor;

a second transistor similar to said first transistor and mounted within the same housing as said first transistor, connected as a voltage inverter amplifier with its base connected to the collector of said first transistor;

a second load resistance connected between a source of D.C. supply voltage and the emitter of said first transistor and being substantially equal to the sum of said first load resistance and the internal cathode to anode resistance of said tube to provide said second transistor with a voltage gain of −1;

a third transistor connected as a voltage inverter amplifier with its base connected to the collector of said second transistor and its collector connected to the output terminal of said amplifier circuit;

a feedback resistance connected between the collector of said third transistor and the emitter of said second transistor; and gain adjust means including a plurality of load resistors and a switch for selectively connecting said load resistors to the emitter of said second transistor, for varying the emitter load resistance of said second transistor to change the gain of said circuit without varying the quiescent D.C. output voltage on the output terminal of said amplifier circuit.

6. A temperature compensated direct coupled amplifier circuit, comprising:

a vacuum tube connected as a cathode follower amplifier with its grid connected to the input terminal of said circuit;

a first transistor connected as a common base amplifier;

a first load resistance connected between the cathode of said tube and the collector of said first transistor;

a second transistor similar to said first transistor, connected as a voltage inverter amplifier with its base connected to the collector of said first transistor;

said first and second transistors being provided in a common housing for maintaining said first and second transistors at substantially the same temperature;

a second load resistance connected between a source of D.C. supply voltage and the emitter of said first transistor and being substantially equal to the sum of said first load resistance and the internal cathode to anode resistance of said tube to provide said second transistor with a negative voltage gain of approximately unity;

a third transistor connected as a voltage inverter amplifier with its base connected to the collector of said second transistor and its collector connected to the output terminal of said circuit;

a coupling resistance connected between the collector of said third transistor and the emitter of said second transistor;

gain adjust means for selectively varying the emitter load resistance of said second transistor to change the gain of said circuit;

a third load resistance connected at one end to collector of said second transistor; and a voltage regulator means connected between the emitter of said third transistor and the other end of said third load resistance to maintain the collector current of said second transistor substantially constant.

7. A temperature compensated direct coupled amplifier circuit, comprising:

a vacuum tube connected as a cathode following amplifier with its grid connected to the input terminal of said circuit;

a first transistor;

a potentiometer having its movable contact connected to the base of said first transistor;

a regulated source of D.C. reference voltage connected across said potentiometer;

a first load resistance connected between the cathode of said tube and the collector of said first transistor;

a second transistor similar to said first transistor connected as a voltage inverter amplifier with its base connected to the collector of said first transistor;

a second load resistance connected between a source of D.C. supply voltage and the emitter of said first transistor and being substantially equal to the sum of said first load resistance and the internal cathode to anode resistance of said tube;

a third transistor connected as a voltage inverter amplifier with its base connected to the collector of said second transistor and its collector connected to the output terminal of said circuit;

a coupling resistance connected between the collector of said third transistor and the emitter of said second transistor to provide negative voltage feedback from the collector to the emitter of said second transistor;

gain adjust means including a switch having its movable contact connected to the emitter of said second transistor for selectively varying the emitter load resistance of said second transistor to change the gain of said amplifier circuit without varying the quiescent output voltage on the output terminal of said amplifier circuit;

a third load resistance including a variable resistance connected at one end to collector of said second transistor; and a voltage regulator diode connected between the emitter of said third transistor and the other end of said third load resistance to maintain the collector current of said second transistor substantially constant.

References Cited

UNITED STATES PATENTS

| | | | |
|---|---|---|---|
| 3,134,078 | 5/1964 | Holmes | 330—3 |
| 3,163,827 | 12/1964 | Kandish | 330—3 |

NATHAN KAUFMAN, *Primary Examiner.*

U.S. Cl. X.R.

330—3, 17, 24, 40; 307—310, 297, 316